United States Patent [19]

Tanabe et al.

[11] Patent Number: 5,776,246

[45] Date of Patent: Jul. 7, 1998

[54] DIAMOND WAFER AND METHOD OF PRODUCING A DIAMOND WAFER

[75] Inventors: Keiichiro Tanabe; Yuichiro Seki; Akihiko Ikegaya; Naoji Fujimori; Hideaki Nakahata; Shin-ichi Shikata, all of Itami, Japan

[73] Assignee: Sumitomo Electric Industries, Ltd., Osaka, Japan

[21] Appl. No.: 418,116

[22] Filed: Apr. 6, 1995

[30] Foreign Application Priority Data

Apr. 7, 1994 [JP] Japan ............................... 6-095930

[51] Int. Cl.[6] .................................................. C30B 29/04
[52] U.S. Cl. .......................... 117/89; 117/104; 117/105; 117/929; 423/446; 427/559
[58] Field of Search ........................ 117/929, 89, 104, 117/105; 423/446; 427/559

[56] References Cited

U.S. PATENT DOCUMENTS

| | | | |
|---|---|---|---|
| 4,836,881 | 6/1989 | Satoh et al. | 423/446 |
| 4,863,529 | 9/1989 | Imai et al. | 437/100 |
| 5,071,785 | 10/1991 | Nakazato et al. | 457/62 |
| 5,240,749 | 8/1993 | Chow . | |
| 5,241,140 | 8/1993 | Itoh et al. | 181/169 |
| 5,270,028 | 12/1993 | Tanabe et al. | 423/446 |
| 5,270,077 | 12/1993 | Knemeyer et al. | 427/249 |
| 5,273,731 | 12/1993 | Anthony et al. | 423/446 |
| 5,294,381 | 3/1994 | Iguchi et al. | 264/25 |
| 5,382,809 | 1/1995 | Nishibayashi et al. | 257/77 |
| 5,587,013 | 12/1996 | Ikegaya et al. | 117/929 |

FOREIGN PATENT DOCUMENTS

| | | |
|---|---|---|
| 0517239 | 12/1992 | European Pat. Off. . |
| 0551730 | 7/1993 | European Pat. Off. . |
| 0562574 | 9/1993 | European Pat. Off. . |
| 0587068 | 3/1994 | European Pat. Off. . |
| 0614998 | 9/1994 | European Pat. Off. . |
| 0040137 | 11/1981 | Germany . |
| 62-252937 | 11/1987 | Japan . |
| 63-256356 | 10/1988 | Japan . |
| 2026900 | 1/1990 | Japan . |
| 2173264 | 7/1990 | Japan . |

OTHER PUBLICATIONS

Patent Abstracts of Japan, vol. 017, No. 434 (E–1412), Aug. 11, 1993 & JP–A–05 090888 (Sumitomo Electric Ind Ltd) Apr. 9, 1993.

Wild et al., "Textured Growth and Twinning in Polycrystalline CVD Diamond Films," Proceedings of the Second International Symposium on Diamond Materials, vol. 91–8 (1991), US, pp. 224–239.

Wolter et al., "Textured Growth of a Diamond on Silicon Via in situ Carburization and Bias–Enhanced Nucleation," Applied Physics Letters, vol. 62, No. 11, 1993, Mar. 15, 1993, pp. 1215–1217.

Shikata et al., "1.5GHz Saw Bandpass Filter Using Poly--Crystalline Diamond," IEEE 1993 Ultrasonics Symposium Proceedings, vol. 1, ISBN 0–7803–1278–3, 1993, pp. 277–280.

Shikata et al, "High Frequency Bandpass Filter Using Polycrystalline Diamond," Diamond and Related Materials, vol. 2, No.8, May 15, 1993, pp. 1197–1202.

Diamond and Related Materials, May 1993, Switzerland, vol. 2 NO. 8, ISSN 0925–9635, PP. 1197–1202.

2300 J. of Crystal Growth 128 (1993) Mar.1, No. 1/4, Amsterdam, NL, 413–417.

IEEE 1993 Ultrasonics Symposium Proceedings, Oct.–Nov. 1993.

Tenth International Conference on Crystal Growth, Aug. 1992.

*Primary Examiner*—Robert Kunemund
*Attorney, Agent, or Firm*—Cushman Darby & Cushman IP Group of Pillsbury Madison & Sutro, LLP:

[57] ABSTRACT

A diamond wafer including a substrate and a (100) oriented polycrystalline diamond film grown on the substrate for making surface acoustic wave devices, semiconductor devices or abrasion-resistant discs. The (100) oriented film is produced by changing a hydrocarbon ratio in a material gas halfway from a higher value to a lower value. The wafer is monotonously distorted with a distortion height H satisfying 2 μm≦|H|≦150 μm. The film is polished to a roughness of less than Rmax50 nm and Ra20 nm.

25 Claims, 3 Drawing Sheets convex-distortion

H < 0 convex-distortion
H < 0 wavy wafer 5,776,246

DIAMOND WAFER AND METHOD OF PRODUCING A DIAMOND WAFER

FIELD OF THE INVENTION

This invention relates to a diamond wafer which is suitable for a material of surface acoustic wave devices, thermistors, substrates of semiconductor devices, pressure-resistant discs, disc protection films or X-ray windows, and a method of producing the diamond wafer.

Diamond is favored with a high sound velocity which is determined by the ratio of the Young modulus to the density. Then the velocity of the surface acoustic wave is extremely high. Diamond is a promising substrate material of surface acoustic wave devices (SAW). SAWs include SAW filters, SAW phase shifters and SAW convolvers. This is an application of diamond as an insulator which makes the best use of the high rigidity and the low specific gravity of diamond.

Diamond can be converted into a semiconductor with a considerably low resistivity by doping impurities. Diamond has excellent properties also as a semiconductor. Therefore, diamond is a much promising material. Diamond would be utilized for various purposes in future.

There are, however, wide diamond wafers have never been produced yet. Thus the devices which make use of diamond have scarcely been produced in practical scale yet. The lack of a wide diamond wafer prevents the fabrication of diamond devices. Wide single crystal diamond wafers have been requested.

BACKGROUND OF THE INVENTION

This application claims the priority of Japanese Patent Application No. 6-95930 (95930/1994) filed Apr. 7, 1994 which is incorporated herein by reference.

Diamond as a natural resource has suffered from a poor yield. Natural diamond crystals are small. If natural diamond crystals were sliced and polished, no wide wafers would be obtained. There is no probability of producing wide diamond wafers from natural diamond crystals. Bulk diamond crystals can be synthesized by a ultra-high pressure method which makes a diamond crystal from solid carbon under an ultra-high pressure at a high temperature. But such a synthesized diamond is small granules. The ultra-high pressure method cannot produce big bulk diamond crystals. The ultra-high pressure diamond is a lump. The lump of diamond should be polished in order to make a thin disc (wafer). The polishing of diamond is, however, very difficult, since diamond is the hardest material. Polishing a diamond lump into a thin diamond plate is nearly impossible, because the polishing will enormously consume time and polishing medium. If a bulk diamond could be polished, a thin plate would be too narrow to make a plenty of devices on the diamond plate. Industrial applications of diamond are subject to wide wafers.

Another synthesis of diamond is CVD methods. The CVD methods can make a diamond film on a suitable substrate from a vapor phase instead of bulk, lump crystals. The CVD methods supply hydrogen gas and a hydrocarbon gas to a heated substrate, excite the gases by heat, discharge or microwave, induce chemical reactions and pile carbon atoms into the diamond structure on the heated substrate.

There are some different CVD methods classified by the differences of exciting the material gas. A hot filament CVD method, a microwave plasma CVD method, a radio-frequency plasma CVD method, a DC plasma jet method, and so on have been known for the methods of making a diamond film.

THE PROBLEMS TO BE SOLVED

Application of diamond to electronics devices is subject to the production of wide diamond wafers. The brilliant success of silicon semiconductor technology depended on the collective treatment through wafer processes on wide wafers (8-inch wafers, 10-inch wafers or so) and the mass production of a plenty of equivalent devices on the same wafer in a single lot. If diamond is applied as a substrate material for electronic devices, optoelectronic devices or optical devices, at least 1-inch diamond wafers should be required. 2-inch wafers or 3-inch wafers will be preferable. More than 3-inch wafers would be still more convenient. However, the ultra-pressure method capable of synthesizing homogeneous diamond would be unable to make such a big bulk diamond with a 1-inch diameter still in future. Thus there would be no possibility of making even a 1-inch homogeneous wafer.

On the contrary, the progress of the vapor phase synthesis (CVDs) enables to produce a wide diamond film on a pertinent substrate. The complex, inhomogeneous wafers instead of the homogeneous wafers, produced by the CVD methods may be used as a diamond wafer, because electronic devices generally use only the surface of wafers. Thus the complex wafers are promising.

Nevertheless, even if wide-area wafers can be made, these wafers are still useless as they are, because the surface of the diamond films is quite rugged. The CVD methods cannot make smooth-surfaced films, since they pile the results of reaction from vapor phase on a substrate. The perturbation of the surface morphology becomes more conspicuous for thicker films. A thin film is almost immune from the disorder of the surface structure, as the smoothness of the substrate is simply transcribed to the surface of the film.

The surface of the wafers must be flat and mirror-smooth in order to make devices by photolithography on the wafers. If the surface of wafers is not mirror-smooth, optical means cannot depict exact patterns on the wafers. The mirror-flat surface is indispensable for the wafers as the substrates of making devices thereon. Then the diamond films grown on a substrate must be polished, so as to obtain the mirror-smooth surface.

The CVD methods can produce a wide area film on a substrate. Thin films with a thickness less than 1 μm have generally been produced on a substrate till now. Thin films cause no mechanical problems on the wafers. When the CVD methods yield a thick film on a substrate, however, the complex wafer is distorted into a convex or into a concave by the generation of inner stresses caused by the difference of thermal expansions between the film and the substrate. The distortion causes a big problem to the complex wafer, because the distortion impedes the polishing of the film. The deformation of the wafers prevents the manufacturers from finishing the diamond film into the roughness (or the smoothness) suitable for the applications to the electronic devices. If deformed wafers are forcibly polished by a conventional machine, either only a small portion is polished with wide unpolished parts left or the wafer itself is broken.

When thin diamond films (about or less than 1 μm) have been produced by the CVD methods, the films have not been polished till now in general, since they are very thin and smooth enough for the conventional uses, for example, cutting tools, abrasion-resistance tools and so forth. The problems of the distortion or the orientation have never been revealed. The substrate materials for electronic devices are a novel application of diamond. The application to the substrate material is subject to mirror-flat surfaces. Thus the polishing is inevitable for making use of the diamond complex wafers as the substrates of electronic or optoelectronic devices. Thick films invite the distortion of the wafers due to the strong inner stress. Distorted wafers must be polished in order to adopt the wafers as the materials of electronic devices. Another problem is the orientation of the diamond crystals. The problem of the orientation originates from the necessity of polishing itself.

Conventional diamond growth by the CVD methods is the production of polycrystalline diamond. A polycrystal includes various shapes, orientations or sizes of monocrystal granules. Therefore, conventional methods have made polycrystal diamond films in which the orientations of monocrystals are fully directed in various directions at random. Conventional methods could not make single crystal films of diamond.

A single crystal film is specified by the plane orientation of the surface. A (klm) single crystal means that surface of the film is (klm)-plane, where k, l and m are plus or minus integers which are collectively called plane indices or Miller indices. A normal which is a line orthogonal to the surface is directed in <klm>-direction. A single crystal can be fully specified by the Miller indices. No Miller index can specify a polycrystal, because the polycrystal contains many, small granules with various Miller indices. "Polycrystal" is an antonym of "single crystal" or "monocrystal". A solid material can, however, take an intermediate crystallographical state, that is, an "oriented" crystal between a polycrystal and a single crystal. The oriented crystal means that almost all the polycrystalline granules have the same plane indices in the surface. Namely, (klm)-oriented crystal means that almost all the individual crystals have <klm> direction in the direction normal to the surface of the film. Other 2-dimensional directions parallel with the surface are, however, still at random for individual crystals unlike a single crystal. Only one crystallographical direction is in common for the polycrystal granules. The substrate plays the role of aligning the granules in the direction of the normal. The oriented crystal is capable of being defined to a film crystal formed on a substrate.

An oriented crystal is also specified by a plane index just (klm) like a single crystal. But it should be noted that a single crystal and an oriented crystal are different from each other in the significance of the plane index (klm). The oriented crystal is named, for example, by a (100) orientation film, a (110) orientation film or a (111) orientation film. Here (klm) is a collective index including ±k, ±l, and ±m. (100), (010), (001), (−100), (0−10) and (00−1) are equivalent and are commonly represented by the (100) orientation.

The orientation crystals have special properties. The Inventors have examined the correlation between the orientation and the polishing. A diamond (110) orientation film suffers from a poor crystallographical property and a large distortion. A diamond (111) orientation film has still a larger distortion due to a big inherent strain. Furthermore, a (111) orientation film has another drawback of the difficulty of polishing because of the extreme hardness of (111) orientation. Without being polished, as-grown (111) oriented film has too rugged a surface to make devices on the film by the wafer processes. (111) plane has another drawback of being subject to an occurrence of twins which makes the crystals to be unsuitable for fabricating devices on them.

On the contrary, a diamond (100) orientation film has a good crystallographical property. Its distortion is smaller than the (110) or (111) orientation film. (100) plane probably is the most suitable face for fabricating electronic, optoelectronic or optical devices on it by the wafer processes. Other difficulties, however, accompany (100) oriented films. One difficulty is the problem of production. The other is the difficulty of polishing. Namely, nobody have known yet how to make (100) oriented films. How can a (100) oriented film be selectively grown on a substrate? Even if a (100) oriented film were produced, the film would not be polished overall by the conventional polishing machine.

OBJECTS AND SUMMARY OF THE INVENTION

A object of the present invention is to provide a smooth, flat diamond-coated wafer which will be utilized as a substrate material for surface acoustic wave devices, semiconductor devices or abrasion-resistant discs.

Another object of the present invention is to provide a smooth, flat diamond-coated wafer having a roughness less than Rmax50 nm and a Ra less than 20 nm.

A further object of the present invention is to provide an as-grown diamond-coated (100) oriented wafer having a distortion ranging from −2 μm to −150 μm or ranging from +2 μm to +150 μm.

A further object of the present invention is to provide a method of producing a (100) oriented diamond-coated wafer.

A still further object of the present invention is to provide a method of polishing the (100) oriented diamond wafer into a roughness less than Rmax50 nm and less than Ra20 nm.

The diamond wafer of this invention has a substrate and a (100) oriented polycrystalline diamond film being synthesized on the substrate by a CVD method and being polished to a roughness less than Rmax50 nm and Ra20 nm. The wafer is monotonously deformed either into a convex-shape or into a concave-shape with a distortion height H of 2 μm≦|H|≦50 μm.

A suitable substrate is a Si single crystal wafer, a GaAs crystal wafer, an AlN crystal wafer, a LiNbO$_3$ wafer, a LiTaO$_3$ wafer, a quartz wafer or so. The wafer should have more than one inch diameter. Suitable thickness of the substrate is from 0.1 mm to 1 mm. The substrate should preparatorily be bruised to a roughness of Ra5 nm to Ra100 nm for enhancing the density of nucleus generation of diamond.

The chemical vapor deposition methods (CVD) have some variations, for example, a filament CVD method, a plasma CVD method, a microwave plasma CVD method and a burner method. The suitable pressure of the reaction chamber ranges from 1 Torr (130 Pa) to 300 Torr (4×10$^4$ Pa). The desirable ratio of (hydrocarbon)/(hydrogen) is in the range from 0.1 vol % to 10 vol %. Typically the material gas includes hydrogen gas and a hydrocarbon gas.

The most important matter of the invention is the (100) orientation of the diamond polycrystal. The hydrocarbon ratio should be changed for making a (100) oriented diamond film. Preferably the ratio of (hydrocarbon)/(hydrogen) should be higher in an earlier stage and lower in a later stage of the synthesis for making a (100) oriented diamond film. The rate of the initial hydrocarbon ratio to the final hydrocarbon ratio should be more than 1.5. Favorably the initial hydrocarbon ratio is more than twice as much as the final hydrocarbon ratio.

The material gas usually consists of hydrogen gas and a hydrocarbon gas. All or a part of the hydrogen gas can, however, be replaced by rare gases, e.g. argon gas, neon gas, etc. Hydrocarbon gas can also be replaced by an organic or inorganic gas containing carbon atoms. Besides, the material gas may contain an organic or inorganic gas including oxygen atoms for improving the surface state of the film.

This invention also polishes the diamond films uniformly till a roughness less than Rmax50 nm and less than Ra20 nm, which enables the electrode formation, impurity implantation, impurity diffusion, or selective etching by photolithography.

DETAILED DESCRIPTION OF THE PREFERRED EMBODIMENTS

Figure 1:
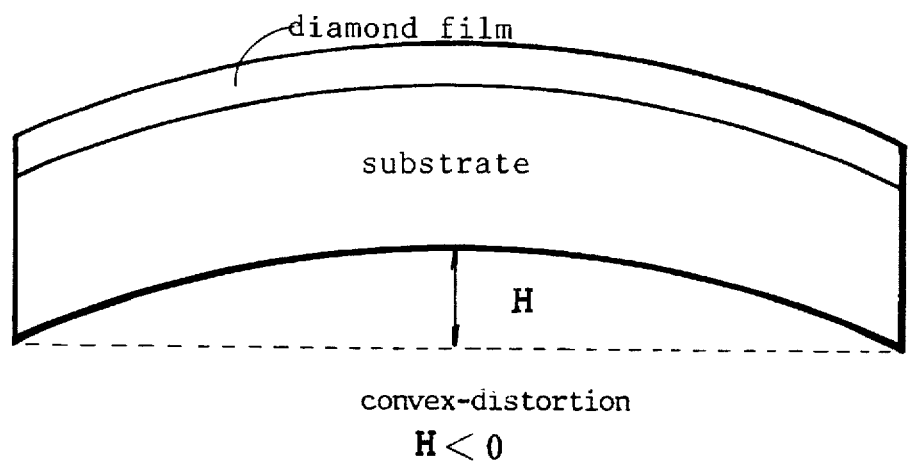
FIG. 1 is a simplified section of a convex-distorted complex wafer for showing the definition of the distortion H.

FIG. 1 indicates a section of a complex diamond wafer produced by the present invention. The complex wafer consists of a substrate of a softer material and a diamond film grown on the substrate. The film is grown at a high temperature by the CVD method. Inner strain originates from the difference of the thermal expansions between the substrate and the diamond film, when the wafer is cooled down to room temperature. The inner strain transforms the wafer either into a convex-shape or into a concave-shape on the film side. The former is called a convex-distortion. The latter is called a concave-distortion. The degree of the distortion is expressed with the height "H" of the center from the plane including the circumference of the wafer. H is positive for the concave-distortion and H is negative for the convex-distortion. FIG. 1 shows an example of the convex-distortion (H<0). This invention requires the absolute value of the distortion H between 2 µm and 150 µm for the complex wafer after the synthesis. The requirement includes both the convex-distortion and the concave-distortion within the range. This invention is explained item by item with regard to the diamond films, the substrates and the distortions.

[A. Diamond Films]

The diamond film must be (100)-oriented on the substrate. Random oriented polycrystal is useless in the present invention. The crystallographical structure is examined by the X-ray diffraction measurement. The diamond films are examined by the 2θ-θ scanning by an X-ray diffraction apparatus having a Cu-anode X-ray tube and a Ni-filter. The 2θ- scanning method shoots an object by X-rays from the direction inclining to the substrate at θ and measures the power of the X-rays diffracted into the direction of an angle 2θ inclining in the reverse direction to the surface. Since θ must be a variable, the specimen is rotated at Ω around the axis of the specimen and the X-ray detector is rotated at 2Ω around the same axis. Thus this is called a 2θ-θ scanning which is a standard method of the X-ray diffraction measurement. The incident X-rays and the diffracted X-rays are symmetric with regard to the normal of the surface. Thus the spacing of the planes which are parallel with the sample surface are calculated from the distribution of the power of the diffracted X-rays as a function of θ. The plane spacing is determined by Bragg's condition, i.e. 2dsinθ=λ, where d is the plane distance, θ is half of the diffraction angle and λ is the wavelength (known parameter) of the X-rays. Since the purpose is to seek the spacing of the planes parallel with the surface of the specimen, the 2θ-θ scanning is suitable.

The spacing d of (klm) planes is given by d=a $(k^2+l^2+m^2)^{-1/2}$, where a is the lattice constant. The lattice constant a is a known parameter, since the film is diamond. The diffraction angle θ determines the plane spacing d from Bragg's condition. Miller indices k, l and m which are integers are determined from the known "a" and "d". Thus plane index (klm) corresponds to the incident angle θ (or the diffraction angle). Thus if the relation between the diffraction angle θ and the X-ray power is represented by a graph having an abscissa of the diffraction angle θ and an ordinate of the X-ray power, the graph indicates the probability of the existence of the plane of the Miller index corresponding to θ in parallel with the surface. When this apparatus scans the diffraction angle 2θ in the range between 20 degrees and 149 degrees (2θ=20° to 149°), the diffraction from (111) planes, (220) planes, (311) planes, (400) planes and (331) planes appears in the range.

A (100) orientated film signifies that the power of the diffracted X-rays is the biggest in (400) planes. Here (400) plane diffraction is equivalent to (100) plane diffraction. Since the scanning angle 2θ of X-rays is restricted to be more than 20 degrees, the diffraction from small plane indices such as (100) planes cannot be detected by this 2θ-θ scanning. Of course, if the lower limit of the scanning angle 2θ were extended far lower, the diffraction from (100) planes could be detected. Thus the reason why (400) plane is the object of detection results from the restriction of the mechanism of the apparatus.

Fortunately the diffraction from (100) planes is proportional to the diffraction from (400) planes. A unit cell of diamond lattice structure has four faces parallel with (100) planes. Thus the diffraction from (400) planes appears. The power of diffraction from (100) planes can be replaced by that of the diffraction from (400) planes. When the diffraction from (400) planes is dominant over other diffractions, and another requirement is satisfied, the film is judged as a (100) oriented film. Therefore, (400) orientation is hereafter deemed to be equivalent to (100) orientation.

Another requirement for judging the film to be (100) oriented is the sharp peak of the (100) diffraction. The sharpness of the peak is estimated by the FWHM (width of the peak at half height of the maximum). Then if the diffraction from (400) planes is dominant and the FWHM is less than 20° when 2θ is set to the angle of (400) plane diffraction, the film is (100) oriented. A narrow FWHM of a peak means that the planes of the peak are sharply formed in the polycrystal. A broad FWHM of a peak means that the plane spacing fluctuates for the peak. The probability of the formation of some planes in parallel with the surface of the film is estimated by the height of the peak of the planes itself and the narrowness of the FWHM of the peak.

More than 20° of the FWHM of the (400) peak in the locking curve means a bad crystallographical property of the film and the incompetence for the wafers of electronic devices. In concrete, the loss of signals is very large when an SAW device, e.g. an SAW filter is produced on the wafer of the (400) FWHM more than 20°. The films are judged whether they are (100) oriented or not, by two conditions of the peak height of (400) diffraction and the narrowness of the peak.

Figure 2:
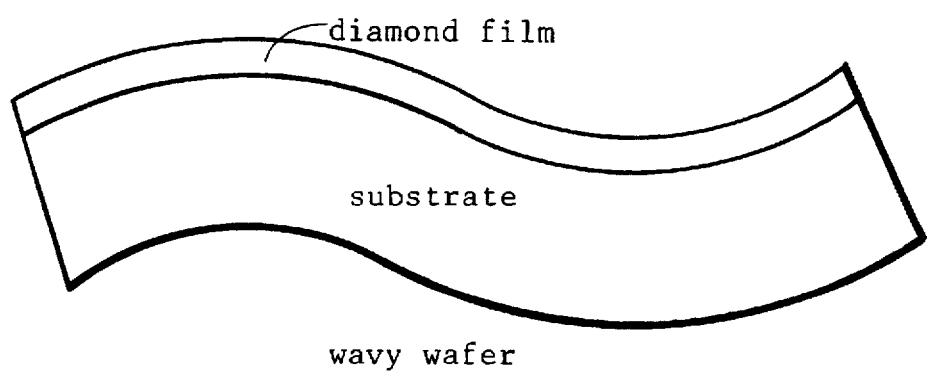
FIG. 2 is an exaggerated section of a flat complex wafer.

If a film is not (400) oriented, the film contains the crystal granules having (110) planes or (111) planes in parallel with the surface. As explained once, (110) plane is difficult to polish and has a disorder of lattice structure. (111) plane is far more difficult to polish, because of the high rigidity and high Young's modulus. There are other difficulties for the films which are not (400) oriented. The distortion is likely to exceed 200 μm in the non-(400) oriented films owing to the big inner strain. The distortion is random or non-uniform. The wafers are liable to bend into a complicated curve with some deflections, e.g. an S-curve and a W-curve in the section, as shown in FIG. 2. Such a wavy wafer cannot be entirely polished. On the contrary, the wafers having a (400) oriented film have a comparatively small and simple distortion less than 200 μm in absolute value. Thus, (400) orientation is optimum for the diamond complex wafers.

[B. Substrates (Base Discs)]

Suitable substrates of making a (100) oriented diamond film are wafers of Si, GaAs, GaP, AlN, SiC, $Si_3N_4$, $LiTaO_3$, $LiNbO_3$, quartz, and so on. In particular, Si wafers are preferable among these materials. A (100) Si wafer is the most suitable in variously-oriented Si wafers. A (100) Si wafer has a function of orientating a diamond film in (100) direction.

The suitable thickness of the substrate is contingent on the material. In general, an appropriate thickness is from 0.1 mm to 1 mm. A substrate thinner than 0.1 mm may be deformed seriously and may be broken during the diamond film synthesis. By contrast, a substrate thicker than 1 mm is inconvenient, because such a thick wafer cannot be treated by the present wafer processes. Thus devices cannot be made on the thick substrate.

The shape of substrate is arbitrary, e.g. rectangular, square or circular. A circular substrate is the most convenient for handling it in the device-making processes. The diameter is also arbitrary. A diameter longer than 1 inch is desirable for the efficiency in the wafer processes. 2-inch, 3-inch, 4-inch 5-inch or 8-inch diameter of substrates is available.

[C. Distortion (Deformation, Strain)]

This invention requires a monotonous distortion of a complex wafer from the center to the periphery. Both a convex-distortion (negative H) and a concave-distortion (positive H) on the film side are allowable. A deflection point (at which the second order differentiation changes the sign + or −) should not exist in any section of the substrate. Monotonous convex-distortion (H<0) has a negative second order differentiation overall. Monotonous concave-distortion (H>0) has a positive second order differentiation.

The preferable absolute value of the distortion height H ranges from 2 μm to 150 μm. Here the distortion of a complex wafer is expressed with the height of the center from the plane including the circumference. The relation between the curvature and the height H is varied by the diameter of the substrate wafer. The curvature is different in the same height H, if the diameter is different. The height is the most suitable parameter for expressing the distortion, because the height of the center is easily measured. Thus the distortion is represented by the height H. The aforementioned requirement is written as 2 μm<|H|<150 μm. More desirable scope of H is expressed by 3 μm<|H|<50 μm.

A flat, non-distortion wafer seems to be the most pertinent for polishing. This invention, however, denies flat, non-distortion wafers after the synthesis. A flat wafer without macroscopic distortion has a tendency of having a wavy surface having small convex portions and concave portions. The section of the wavy wafer has deflection points. The complexity of the wavy film prevents the polishing machine from polishing all the surface uniformly. Some parts are left unpolished or insufficiently-polished. Then this invention rejects flat wafers (H=0).

Therefore, even if the wafer is deformed by the deposition of the film, simpler distortion without deflection is far more desirable than the wavy, complicated deformation. The lower limit of the distortion is determined to 2 μm in order to exclude flat wafers (H=0).

The upper limit is 150 μm. More than 150 μm of distortion is inappropriate, because a wafer having such a big deformation cannot fully be polished. Some portions are left unpolished, in particular, in the vicinity of the circumference. Thus, the wafers having a deformation bigger than 150 μm shall be excluded.

This invention is applicable both to the convex-distorted wafers and the concave-distorted wafers. But the convex-distortion is more suitable than the concave-distortion. The scope of distortion is represented by −150 μm<H<−2 μm. Further, pertinent scope of the distortion is −50 μm<H<−3 μm.

[EXAMPLES]

Diamond wafers are produced by coating a diamond film on a substrate, polishing the film according to the present invention, forming interdigital electrodes on the film by evaporating aluminum film, selectively etching the film into parallel electrode patterns and examining the yield of the wire-cutting of the interdigital electrodes. FIG. 3 to FIG. 7 indicate the processes of the fabrication of films, the polishing of films and the formation of electrodes.

Figure 3:
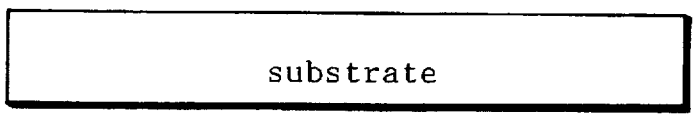
FIG. 3 is a section of a substrate at the first step of making a surface acoustic wave device.
Figure 4:
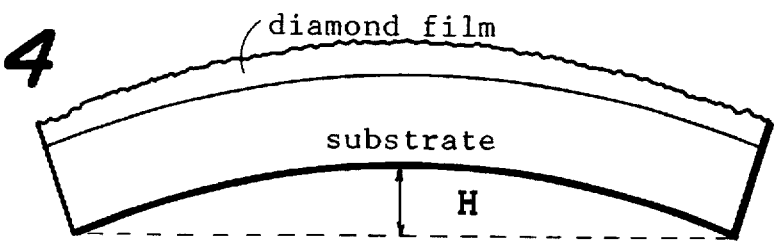
FIG. 4 is a section of a complex wafer having a substrate and a rugged diamond film grown on the substrate for showing the convex-distortion caused by the synthesis.
Figure 5:
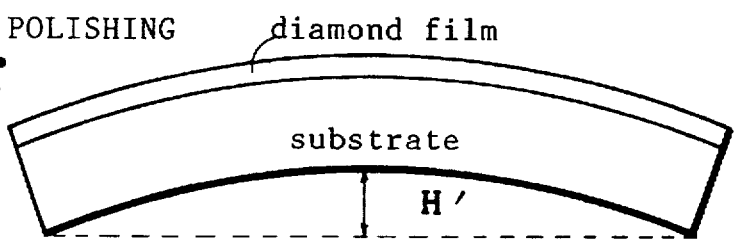
FIG. 5 is a section of a complex wafer having a substrate and a polished diamond film.

At first, flat and circular substrates are prepared, as shown in FIG. 3. Diamond films are made on the substrate from a material gas by the microwave plasma CVD method, the filament CVD method, the plasma jet CVD method and the burner method. The material gas includes hydrogen gas and a hydrocarbon gas. In the examples, the ratio ($CH_4/H_2$) of methane gas to hydrogen gas is 0.1 to 10 vol %. The pressure in the reaction chamber is 1 Torr (133 Pa) to 300 Torr ($4 \times 10^4$ Pa). Rugged diamond films are produced on the substrate, as shown in FIG. 4. The inner stress deforms the wafers. The rugged surface of the complex wafers is polished by a mechanical polishing machine. The surface becomes smooth enough but the distortion survives the polishing. FIG. 5 indicates the polished wafer. The orientation of the crystals on the diamond film is investigated by the X-ray diffraction method. In particular, the power ratio of the diffracted X-rays as a function of θ is measured in the 2θ-θ scanning. The locking curve of (400) planes is determined for all samples by the θ scanning, and the FWHM is measured from the locking curve.

Figure 6:
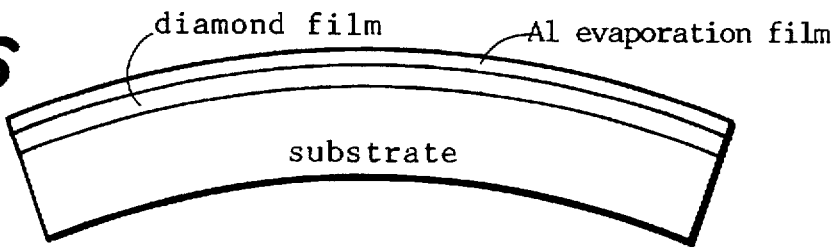
FIG. 6 is a section of a complex wafer on which an aluminium layer is evaporated on the smooth diamond film.
Figure 7:
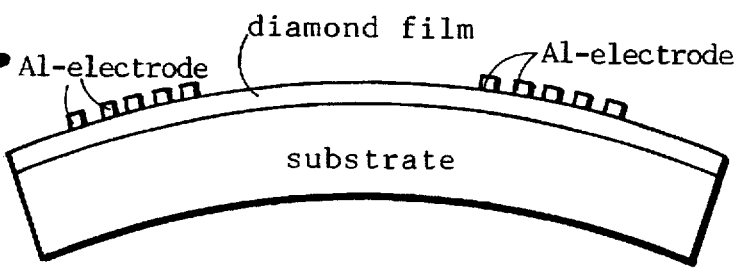
FIG. 7 is a section of a complex wafer on which aluminum interdigital transducers are formed.
Figure 8:
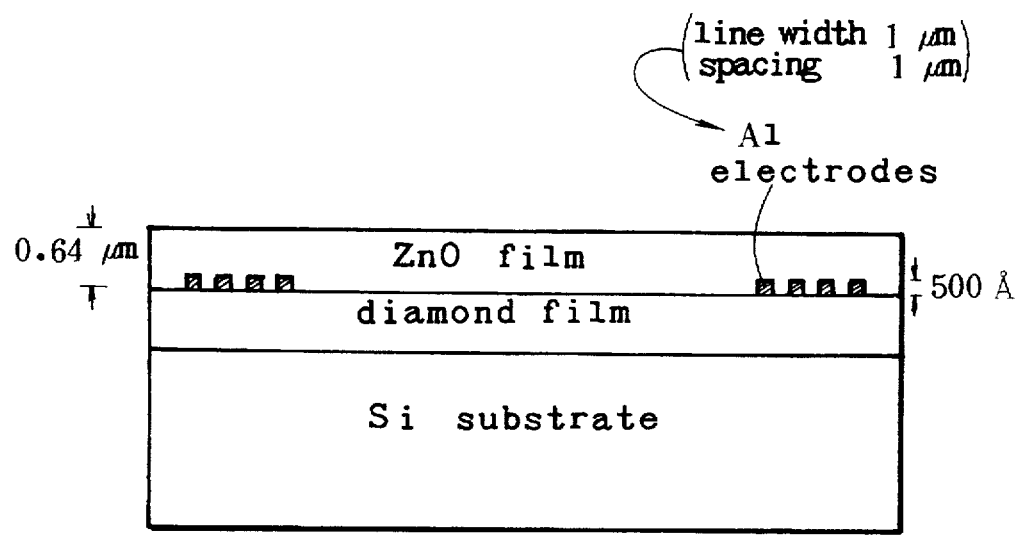
FIG. 8 is a section of a surface acoustic wave filter.

An aluminum film is evaporated on the diamond film which is shown in FIG. 6. Fine wire patterns are formed by etching parts of the aluminum film by photolithography. These metal patterns compose parallel fine electrodes which build an interdigital transducer of a SAW device. The line width is varied from 0.6 μm to 2 μm. FIG. 7 shows the section of the wafer having the diamond film and the aluminum (interdigital transducer) electrodes. Then the yield against wire-cutting is investigated for the samples. The results are listed in Table 1, Table 2 and Table 3'.

This invention aims at making a (100) oriented film. The experiments disclose the fact that the following contrivances are effective for aligning (111) direction of the polycrystal granules in parallel with the normal of the film. ① In an earlier stage of coating the substrate with diamond, the methane concentration (methane/hydrogen) is set at a high ratio (more than 2 vol %). The highness of the methane ratio facilitates the generation of nuclei of diamond crystals on the substrate. The preferable density of nucleus generation is more than $10^{10}/cm^2$. ② After the diamond film has been synthesized for about 30 minutes, the methane concentration is reduced to a lower ratio. Then the diamond film is grown from the material gas having a lower methane concentration.

The two-step methane concentration is essential for producing a (100) oriented film. The (100) oriented film can be synthesized by a higher methane concentration in an early stage and a lower methane concentration in a later stage. If the methane concentration were kept in a high value from beginning to end, the film would contain (110) oriented diamond crystals and bad diamond crystals containing carbon ingredients instead of (100) crystals. Such a film is useless. On the contrary, if the methane concentration were kept in a low value throughout the synthesis, the diamond crystals would be oriented in (111) direction on the substrate. A (111) oriented crystal is the hardest among various orientations and has the highest Young modulus. A large distortion accompanies (111) oriented films. The extreme hardness and the big distortion make the polishing of (111) films far more difficult than (100) films.

Therefore, a (100) oriented film can be produced by controlling the material gas so as to have a higher concentration of hydrocarbon in an early stage and a lower concentration of hydrocarbon in a later stage.

As mentioned before, the density of nucleus generation should be more than $10^{10}/cm^2$. The density is contingent on the roughness of the substrate. The roughness of the substrate should be raised to the scope from Ra1 nm to Ra100 nm by bruising treatments, e.g. blast of diamond powder, electropolishing, etc.

Twelve samples are prepared, polished and examined. Table 1 lists the substrate, the thickness of the substrate, the diameter of the substrate, the method of synthesis and the thickness of the grown diamond film in reference to all the samples.

TABLE 1

Substrate, substrate thickness, substrate diameter, synthesis method and film thickness

| NO | substrate | substrate thickness (mm) | substrate diameter (inch) | snthesis (CVD-method) | film thickness (μm) |
|----|-----------|--------------------------|---------------------------|------------------------|---------------------|
| 1  | Si (100)  | 1    | 2   | microwave | 30   |
| 2  | Si (100)  | 1    | 4   | filament  | 50   |
| 3  | Si (111)  | 0.35 | 8   | filament  | 100  |
| 4  | GaAs      | 0.1  | 1   | microwave | 15   |
| 5  | AlN       | 0.8  | 3   | filament  | 5    |
| 6  | LiNbO₃    | 0.5  | 2   | filament  | 30   |
| 7  | LiTaO₃    | 0.3  | 5   | microwave | 100  |
| 8  | Quartz    | 1    | 4   | filament  | 5    |
| 9  | Si (poly) | 0.05 | 2   | microwave | 150  |
| 10 | Si (111)  | 1    | 8   | filament  | 2    |
| 11 | LiNbO₃    | 3    | 0.5 | filament  | 1000 |
| 12 | GaAs      | 0.5  | 8   | microwave | 30   |

Samples 1 to sample 8 are embodiments of the present invention. Samples 9 to sample 12 are comparison examples. In the column of synthesis (CVD-method), "filament" means the filament CVD method, and "microwave" means the microwave plasma CVD method. the unit of the thickness of the substrate is "mm". The unit of the diameter is "inch" (25 mm). The substrate discs are a Si(100) wafer, a Si(111) wafer, a GaAs wafer, an AlN wafer, a LiNbO₃ wafer, a LiTaO₂ wafer and a quartz wafer. The thickness of the substrate is dispersed between 0.1 mm and 1 mm. The diameter of the substrate is 1 inch (25 mm) to 8 inch (200 mm). The unit of the thickness of films is "μm". The diamond films have a thickness from 5 μm to 1000 μm.

The synthesis of the diamond films is generally carried out by the steps of setting a substrate on a susceptor in a reaction chamber, heating the substrate, supplying a material gas into the reaction chamber, exciting the material gas by heat, microwave, RF-discharge or DC-discharge, inducing a chemical reaction and piling the result of the reaction on the heated substrate. The material gas contains hydrogen gas and a hydrocarbon gas. As clarified before, the generation of (100) oriented crystals requires a midway change of the ratio of hydrocarbon to hydrogen from a higher ratio (more than 2 vol %) to a lower ratio. Thus, the embodiments, samples 1 to 8, are made by reducing the methane concentration in the material gas at the halfway point. In an early step, the density of nucleus generation is enhanced by raising the methane concentration. In the later stage, a (100) oriented diamond film of a good quality is produced by reducing the concentration of hydrocarbon in the material gas. Table 2 indicates the synthesizing conditions of the diamond films of samples 1 to 12. The comparison examples are made from a material gas containing methane having a constant ratio.

TABLE 2

Conditions of synthesizing diamond films

| NO | total flux of material gas (cc/m) | ratio of methane to hydrogen (CH₄/H₂) vol % | | pressure (Torr) |
|----|-----------------------------------|------------------------------|----------------------|-----------------|
|    |                                   | ratio in early 30 minutes    | ratio in later stage |                 |
| 1  | 1500 | 4   | 2   | 20  |
| 2  | 1000 | 3   | 1.5 | 100 |
| 3  | 600  | 10  | 0.5 | 300 |
| 4  | 200  | 2   | 1   | 60  |
| 5  | 1000 | 3.5 | 0.8 | 1   |
| 6  | 800  | 4   | 0.6 | 70  |
| 7  | 200  | 8   | 3   | 250 |
| 8  | 50   | 6   | 0.5 | 200 |
| 9  | 300  | 1.5 |     | 20  |
| 10 | 500  | 0.5 |     | 25  |
| 11 | 1000 | 10  |     | 150 |
| 12 | 400  | 3   |     | 200 |

Table 2 shows the synthesizing conditions, that is, the total flux of material gas, the ratio of (CH₄/H₂) in the early 30 minutes, the ratio of (CH₄/H₂) after 30 minutes and the pressure of the reaction chamber. In this case, the total flux is a sum of the flux of hydrogen gas and the flux of methane gas. The total flux of the material gas is 50 cc/m to 1500 cc/m in samples 1 to 12. The methane concentration in the material gas is represented by the volume ratio (vol %) of methane gas to hydrogen gas. The methane ratio is distributed from 0.5 vol % to 10 vol % in the samples. FIG. 4 shows the section of the wafer on which a diamond film has been grown. The embodiments, sample 1 to sample 8, adopt a higher methane ratio for 30 minutes from the beginning and a lower methane ratio in the following term after 30 minutes. The initial higher concentration of methane promotes the nucleus generation on the substrate. The following lower concentration of methane has a tendency of making diamond granules having a (100) axis vertical to the surface of the substrate.

Each embodiment (samples 1 to 8) has an initial methane concentration between 2 vol % and 10 vol % and a later methane concentration between 0.5 vol % and 3 vol %.

Samples 1, 2 and 4 reduce the methane ratio to 0.5 of the initial one. Sample 3 reduces the methane ratio from 10 vol % to 0.5 vol %. The reduction rate is 1/20 in sample 3. Sample 5 decreases the methane to 1/4. Sample 6 diminishes the methane ratio to 1/6. The reduction rate of sample 8 is 1/12. The pressure is 1 Torr (130 Pa) to 300 Torr (40 kPa).

By contrast, the comparison examples 9 to 12 have constant methane ratios between 0.5 vol % and 10 vol %. The pressure is 20 Torr (2700 Pa) to 200 Torr (27000 Pa).

The substrate of sample 1 has a roughness of Ra10nm. Sample 1 has a high density of nucleus generation of $5 \times 10^{11}/cm^2$. The substrate of sample 10 has a roughness of Ra250 nm. Sample 10 has a very low density of nucleus generation of $6 \times 10^3/cm^2$. The substrate of sample 11 has a roughness of Ra1 nm. Sample 11 has a low density of nucleus generation of $8 \times 10^6/cm^2$.

The samples are analysed by the X-ray diffraction method. The ratios of diffraction power among (111), (220), (311), (400) and (331) plane diffractions and the FWHM at 2θ=(400) are measured. Table 3 indicates the results.

TABLE 3

Diffraction ratios of planes in X-ray diffraction analysis

| | X-ray diffraction 2θ-θ scanning ratios of diffraction of planes | | | | | Locking 2θ = (400) fixed θ scanning |
|---|---|---|---|---|---|---|
| NO | (111) | (220) | (311) | (400) | (331) | FWHM (°) |
| 1 | 0 | 1 | 0 | 100 | 0 | 4 |
| 2 | 1 | 2 | 1 | 100 | 0 | 5 |
| 3 | 15 | 25 | 9 | 100 | 4 | 14 |
| 4 | 1 | 1 | 1 | 100 | 1 | 6 |
| 5 | 0 | 2 | 0 | 100 | 0 | 10 |
| 6 | 4 | 1 | 2 | 100 | 3 | 5 |
| 7 | 40 | 50 | 3 | 100 | 10 | 19 |
| 8 | 10 | 3 | 3 | 100 | 2 | 13 |
| 9 | 100 | 4 | 3 | 20 | 3 | 21 |
| 10 | 100 | 1 | 1 | 1 | 13 | 35 |
| 11 | 0 | 100 | 0 | 0 | 0 | 48 |
| 12 | 4 | 100 | 1 | 0 | 10 | 40 |

The diffraction angle and the plane spacing d satisfy Bragg's relation $2d\sin\theta = \lambda$. The 2θ-θ scanning method shoots an object from the direction of an inclination θ to the surface and detects the power of the diffracted X-rays in the direction of θ to the surface. The power of the maximum diffraction is signified by "100". The power of other diffraction is denoted by the ratio. All the embodiments, i.e. samples 1 to 8, show the maximum value at (400) diffraction which is allotted with "100". (400) planes are parallel with (100) planes but four (400) planes are included in a spacing between a pair of neighboring (100) planes. Diamond crystal contains four layered carbon atoms in a single lattice constant. Then (400) diffraction appears. The existence of the strong (400) diffraction means that (100) planes are formed in parallel with the surface of the substrate in many diamond crystal granules.

Sample 1 and sample 2 have little diffraction other than (400) plane diffraction. This fact means samples 1 and 2 are uniquely oriented in (100) direction. Namely, (100) planes of polycrystals are in parallel with the surface. Samples 4, 5 and 6 have little diffraction other than (100) plane diffraction. The FWHM is very small in samples 1, 2, 4, 5 and 6. Then these samples are well (100) oriented, although they are polycrystalline.

Sample 3 has some crystals whose (220) planes or (111) planes are in parallel with the surface. (220) oriented crystals and (111) oriented crystals exist on the surface of sample 3.

Sample 7 includes the crystal granules with (220) planes or with (111) planes which are in parallel with the surface. The FWHM of (400) diffraction of sample 7 is the biggest among the samples 1 to 8. Then samples 3, 7 and 8 are also (100) oriented, but (100) orientation of samples 3, 7 and 8 is weaker than that of samples 1, 2, 4, 5 and 6.

The comparison examples, i.e. samples 9 to 12, have many crystal granules which are oriented more of other direction than (100) direction, because the power from (400) diffraction is weak. In samples 9 and 10, (111) diffraction is the strongest. Sample 9 is produced from a material gas including 1.5 vol % of methane. Sample 10 is synthesized from another material gas including 0.5 vol % of methane. Probably the low, constant methane concentration would produce (111) oriented films. Samples 11 and 12 exhibit prevailing diffraction from (220) planes. They have been made by the affluent supply of material gas with high density of methane under high pressure. In particular, sample 11 has a very thick film (1000 µm) which has been produced under an extremely high methane concentration (10 vol %). Sample 11 is almost perfectly (110) oriented, because other diffractions than (220) are zero. Table 4 lists the roughness and the distortion of the samples just after the synthesis of the diamond film.

TABLE 4

Roughness and distortion of diamond films

| | roughness after synthesis | | distortion |
|---|---|---|---|
| NO | Rmax (µm) | Ra (µm) | height H (µm) |
| 1 | 2.5 | 0.8 | −6 |
| 2 | 3.3 | 0.7 | −18 |
| 3 | 7 | 2.1 | −142 |
| 4 | 1.3 | 0.4 | −30 |
| 5 | 0.5 | 0.25 | −2.5 |
| 6 | 2.4 | 0.6 | −15 |
| 7 | 8.5 | 1.8 | +3 |
| 8 | 0.8 | 0.34 | +25 |
| 9 | 11 | 4.2 | +200 |
| 10 | 0.6 | 0.15 | +400 |
| 11 | 230 | 18 | break of wafer |
| 12 | 3.8 | 1.1 | 0 |

The roughness of a surface is well signified by Rmax and Ra. Rmax is the maximum of differences of the height between peaks and valleys. Ra is the average of differences of the height between peaks and their neighboring valleys. Rmax of the diamond films of samples 1 to 12 is broadly distributed from 0.5 µm to 230 µm. Ra is dispersed between 0.15 µm and 18 µm.

Samples 1, 2, 4, 5 and 6 which have good (100)-oriented films have sufficiently small Rmax and Ra. This implies the excellence of (100) oriented film. In particular, sample 5 has a very small roughness of Rmax0.5 µm and Ra0.25 µm. Sample 5 has grown a very thin diamond film of a 5 µm thickness on an AlN substrate by the filament CVD method. Good smoothness probably originates partly from the thinness of the film and partly from (100) orientation of the film.

Similarly, in sample 8, has been produced by a thin diamond film has been deposited on a 4-inch quartz substrate by the filament CVD method. The smoothness of sample 8 is next to highest sample 5. The thinness of the film suppresses the roughness. The small deviation from (100) orientation probably degrades the smoothness of sample 8 in comparison with sample 5.

Samples 3 and 7 which include some non-(100) oriented components of crystals have an intermediate degree of the roughness.

In the comparison examples, sample 9 has a moderate roughness of Rmax11 μm and Ra4.2 μm. Sample 10 is favored with a smoothness of Rmax.0.6 and Ra0.15. This is because the diamond film is thin enough (t=2 μm). The smoothness of the substrate (111) Si is simply transcribed on the film. Sample 11, however, has an extremely big roughness of Rmax230 μm and Ra18 μm. The roughness probably results partly from too big thickness (1000 μm=1 mm) of the diamond film and partly from the unsuitable (110) orientation of the film. Unfortunately, sample 11 is broken by the film deposition, which would be brought about by a large inner stress borne caused by the too thick film. Sample 10 has a small roughness of Rmax3.8 μm and Ra1.1 μm. The smoothness may be derived from the GaAs substrate.

Then the distortion of the samples is explained. Here the distortion is defined by the height H of the center from the plane including the circumference of a wafer. Distortion may otherwise be defined by the curvature or the radius of curvature. The definition by the height H is different from the other definition by the curvature. If two wafers have the same curvature, a broader wafer has a higher height H of distortion than a narrower wafer. If the distortion is spherical, the height H and the radius R of curvature satisfy the relation of $H=D^2/8R$.

The difference of the thermal expansion coefficients between the substrate and the diamond film causes compressive stress or tensile stress in the complex wafer. The inner stress deforms the complex wafer either into a convex-shape or into a concave-shape on the film side. The distortion parameter H is defined to be negative for the convex-distortion (H<0) but to be positive for the concave-distortion (H>0), which has been described before.

Samples 1 to 6 are deformed into a convex-shape (H<0), as shown in FIG. 1. The distortion is caused by the compressive stress in the diamond film and the tensile stress in the substrate. The convex-distortion of samples 1 to 6 ranges from −2.5 μm to −142 μm.

Samples 1, 2, 4, 5 and 6 which feature the dominance of (100) orientation are commonly favored with a moderate convex-distortion from −2.5 μm to −30 μm. Sample 3 which contains (110) and (111) oriented components a little on the (111) Si substrate is deformed into a very big convex-distortion of H=−142 μm. Sample 7 which includes (110) and (111) oriented components in the film is deformed into a quite small concave-distortion of +3 μm. Sample 8 which has a thin film (5 μm) on the quartz wafer is deformed into a concave-distorted (H=+25 μm) wafer.

Among the comparison examples, sample 9 has a big positive distortion of +200 μm. Sample 10 has a still bigger positive distortion of +400 μm. The concave-distortion derives from the tensile stress in the diamond film and the compressive stress in the substrate. (111) oriented granules are quite dominant in the films of samples 9 and 10 instead of (100) oriented crystals. Sample 10 has only a very thin film (2 μm) on Si(111) but invites a big concave-distortion. The thin film bears a strong tensile stress. Sample 11 is broken down because of the big strain caused by a large film thickness of 1000 μm. Sample 12 which has a 30 μm thick diamond film on a 3-inch GaAs wafer has neither convex-distortion nor concave-distortion. Sample 12 is thus a flat wafer. Besides the flatness, sample 12 is favored with small roughness. Sample 12 seems a very promising wafer.

These complex wafers have all too big a roughness to make electronic devices on the films by photolithography which requires at least a smoothness of less than Rmax50 nm and Ra20 nm. The films must be polished till a desired smoothness.

Thus, the films are polished in the state of being stuck to the substrate by a polishing machine. FIG. 5 indicates the section of the samples after the polishing. After the polishing, the roughnesses of the distortion is measured for all the samples except sample 11 which cannot be polished due to the break of the substrate. Some of the samples cannot fully be whetted. Then the ratio of the polished parts to the whole surface is also measured. The roughness is of course reduced by the polishing. The distortion has a tendency of reducing by the polishing. Table 5 exhibits the roughness, the ratio of the polished parts and the distortion of the samples after the polishing.

TABLE 5

Roughness (nm), ratio of polished parts (%), distortion (μm) of diamond wafer after polishing

| NO | roughness (nm) Rmax | Ra | ratio of polished parts (%) | distortion height H' (μm) |
|---|---|---|---|---|
| 1 | 4 | 0.5 | 100% polished | −5 |
| 2 | 12 | 3 | 100% polished | −15 |
| 3 | 48 | 18 | 100% polished | −60 |
| 4 | 3.2 | 1.5 | 100% polished | −10 |
| 5 | 0.5 | 0.15 | 100% polished | −2.1 |
| 6 | 1.5 | 0.7 | 100% polished | −10 |
| 7 | 10 | 8 | 100% polished | +2.5 |
| 8 | 30 | 12 | 100% polished | +15 |
| 9 | 90 | 70 | 30% unpolished | +200 |
| 10 | 150 | 60 | 80% unpolished | +380 |
| 11 | not polished, since substrate is broken. | | | |
| 12 | 120 | 50 | 10% unpolished | 0 |

(Be careful of the unit (nm) of roughness. 1000 nm = 1 μm)

The unit of roughness is changed into nm (nanometer) here instead of μm (1 μm=1000 nm) in Table 4. The roughness Rmax is distributed between Rmax0.5 nm and Rmax150 nm, and Ra is dispersed between Ra0.15 nm and Ra70 nm. Samples 1, 2, 4, 5 and 6 which have (100) oriented films attain all a sufficient smoothness of less than Rmax50 nm and less than Ra20 nm. Sample 1 has a roughness of the film to Rmax4 nm and Ra0.5 nm after the polishing. Rmax reduces to about 1/600. Ra decreases to about 1/1600. Sample 2 has Rmax12 nm and Ra3 nm. The reduction ratios are 1/270 and 1/230 for Rmax and Ra respectively. Sample 4 has Rmax3.2 nm and Ra1.5 nm.

Sample 5 which inherently has a small roughness before polishing obtains Rmax0.5 nm and Ra0.15 nm. The reduction ratios are 1/1000 and 1/1700. Sample 5 which is the smoothest specimen among the samples has been produced by depositing a 5 μm diamond film on a 3-inch AlN substrate by the filament CVD method. Furthermore, sample 5 shows a strong (100) orientation of the film. These conditions favor the production of the quite smooth film of sample 5. Sample 6 has also a satisfactory roughness of RMax1.5 nm and Ra0.7 nm.

Samples 3, 7 and 8 which include (110) oriented crystals and (111) oriented crystals besides (100) ones have a little large roughness, although they content the requirement of the roughness of less than Rmax50 nm and Ra20 nm. Sample 3 which has originally a large roughness has Rmax48 nm and Ra18 nm after the polishing which are the biggest values among the embodiments of samples 1 to 8. Generally, Rmax or Ra is reduced to 1/100 to 1/2000 by the polishing of samples 1 to 7. Sample 8 is an exceptional case. Sample 8 having a small roughness of Rmax800 nm and Ra340 nm has still a considerably big roughness of Rmax30 nm and Ra12 nm. The reduction ratios are 1/26 and 1/28.

The small reduction may result from the unfavorable mode of distortion (concave-distortion). All the embodiments, that is, samples 1 to 8, are polished perfectly (100% polished). The distortions H' have been slightly reduced from the original distortions H in all the embodiments.

Sample 9, a comparison example, has a roughness of Rmax90 nm and Ra70 nm which do not satisfy the requirement of the roughness of less than Rmax50 nm and Ra20 nm. This sample is inherently very rugged and is hard to polish because of (111) orientation and the large concave-distortion of +200 μm. About 30% of the surface is left unpolished in sample 9.

Sample 10, another comparison example, which had initially a low roughness of Rmax 600 nm and Ra150 nm after the film formation has still a big roughness of Rmax150 nm and Ra60 nm after the polishing. The reduction ratios are only 1/4 and 1/25. 80% of the surface cannot be polished. The polishing is not effective, partly because the film is (111) oriented and partly because the distortion is a too big concave mode of +400 μm. Sample 9 and 10 indicate that a (111) oriented film is inappropriate for being polished. Then (111) plane can be called a "polishing-difficult plane". (100) plane is the most suitable plane for the diamond films.

Sample 11 is not polished, because it has been broken in the process of the film formation. Sample 12 which has a GaAs substrate was initially favored with a low roughness. But the polishing is not so effective for sample 12. The roughness after the polishing is Rmax120 nm and Ra50 nm which cannot content the requirement of photolithograpy. The reduction is only 1/29 in Rmax and 1/20 in Ra. Sample 12 seemed to be a good specimen both because of the initial small roughness and because of the flatness of the wafer. The truth is otherwise. Sample 12 has drawbacks of a large roughness and an existence of 10% of unpolished part. A flat wafer has small convexes and concaves on the film. The small irregularity of a flat film impedes the polishing function. The other reason is (110) orientation of the film, which also prevents the polishing.

The polishing slightly reduces the distortion but does not change the distortion mode. Samples 1 to 6 are convex-distorted. Samples 7, 8, 9, 10, and 12 are concave-distorted. The embodiments, i.e. sample 1 to sample 8, have very smooth surfaces having a small roughness of Rmax0.5 nm to Rmax48 nm and Ra0.15 nm to Ra18 nm. The comparison examples 9, 10 and 12 are annoyed by a big roughness between Rmax90 nm and Rmax150 nm and between Ra50 nm and Ra70 nm.

Then an aluminum film with a thickness of 50 nm (=0.5 μm) is evaporated on the diamond film of each sample. FIG. 6 denotes the section of the wafer. Comb-shaped electrodes are produced on the diamond film by selectively etching the Al film into parallel electrode patterns by photolithography. The line width of the electrodes is varied between 0.6 μm and 2 μm. The comb-shaped electrode is sometimes called an interdigital transducer which plays the role of an input electrode or an output electrode of an SAW device. Since the diamond films have the microscopic roughness, as listed in Table 5, there is some probability of wire-cutting of the interdigital transducers formed on the diamond film as an undercoat. Then the ratios of the specimens, which are immune from the trouble of wire-cutting, are counted. Table 6 denotes the line width of the aluminum interdigital electrodes and the yield to wire-cutting of the samples.

TABLE 6

Width of aluminum electrodes and yield against wire cut of aluminum electrode formed on diamond films by evaporation and photolithography

| NO | width of aluminum electrodes (μm) | yield against wire cut (%) |
|---|---|---|
| 1 | 1 | 99% |
| 2 | 0.8 | 97% |
| 3 | 1.2 | 90% |
| 4 | 1.5 | 96% |
| 5 | 0.6 | 95% |
| 6 | 1 | 99% |
| 7 | 0.8 | 94% |
| 8 | 2 | 92% |
| 9 | Electrodes are not formed, because of wide unpolished parts | |
| 10 | 1 | 2% |
| 11 | Substrate is broken during synthesis, not polished, not make electrodes | |
| 12 | 0.8 | 12% |

The line width of the aluminum electrodes ranges from 0.6 μm to 2 μm. Samples 1 to 8, i.e. the embodiments, exhibit a high yield to wire-cutting of more than 90%. Then wire-cutting scarcely occurs in almost all of the embodiments. This results from the excellent smoothness of the polished diamond films. Samples 1 and 6 enjoy an extremely high yield of 99%. Sample 2, in particular, which has the second narrowest line width of 0.8 μm, enjoys a high yield of 97%. Sample 5 with the narrowest width of 0.6 μm has still a yield of 95%. Sample 3 has the lowest yield of 90% among the embodiments. The low yield is derived from the considerably high roughness of the film which is caused by the mixture of (111) and (110) oriented crystals in the dominant (100) crystals. Similarly, the low yield of sample 8 originates from the mixture of (111) oriented crystals in the film. The result shows that the diamond wafers produced by the present invention are capable of using as substrates of surface acoustic wave devices, in which the diamond film raises the speed of the surface acoustic waves.

In the comparison examples, sample 9 has too wide unpolished parts. Thus electrodes are not formed on sample 9. Although sample 10 has wide unpolished parts, electrodes of a 1 μm width are formed on sample 10 for examining the yield to wire-cutting. The yield is 2%. Almost all electrodes are cut on sample 10. Sample 12 has 10% of unpolished parts. Electrodes are produced on the polished portions. The yield is 12%. Samples 10 and 12 have a drawback of a low yield of the interdigital transducers. This is caused by the big roughness of the undercoat diamond film. Parts of the Al patterns cannot adhere to the rugged film, and the Al wires are cut by the rugged film. The formation of good electrodes requires a sufficient smoothness to the diamond films.

[Application to Surface Acoustic Wave Filter]

The complex wafer proposed by the present invention is useful as substrates of surface acoustic wave devices. The application to surface acoustic wave filters will be further explained.

3-inch (100) silicon wafers are used as substrates. The resistivity of the wafers ranges from $10^{-5} \Omega$ cm to $10^3 \Omega$ cm. The (100) Si wafer is bruised by electropolishing in order to give a roughness between Ra5 nm and Ra100 nm. The roughness of the substrate has a great influence upon the sizes of diamond granules in a polycrystal. The average diameter of crystal granules can be controlled by the roughness of the substrate, the temperature of the substrate and the microwave power. A plenty of equivalent SAW filters are made on a single wafer.

The substrate wafer is laid on a susceptor in a microwave plasma CVD chamber. The substrate is heated to a high temperature between 300° C. and 850° C. Lower substrate temperature is favorable for making smaller grains. Higher substrate temperature favors the growth of bigger grains. A material gas, which contains hydrogen gas and a methane gas with 10:1 ratio, is supplied to the reaction chamber for early 10 minutes. The total flux of the material gas is 20 sccm. The pressure in the chamber is about 40 Torr ($5.3 \times 10^3$ Pa). Then microwave is introduced into the chamber for exciting the material gas into plasma. The power of microwave is changed for varying the sizes of diamond grains in the film.

The high methane ratio and the bruising treatment raise the density of nucleus generation of diamond in the early stage. The density of nucleus generation must be higher than $10^{10}/cm^2$. The density of the nucleus generation is monitored by counting the nucleus borne on another equivalent Si wafer in the chamber. The density of the nucleus is distributed from $1 \times 10^{10}/cm^2$ to $2 \times 10^{11}/cm^2$. Then the ratio of methane to hydrogen is reduced from 1:10 to 1:200 after ten minutes from the beginning. The total flux is still 20 sccm. A 25 μm thick diamond film is produced on the 3-inch (100) Si wafer. The X-ray diffraction analysis confirms the (100) orientation of the diamond film. The average diameter of the crystal grains in the diamond film is measured, because the grain size is an important parameter for determining the scattering of the surface acoustic wave, which has been found by the Inventors of this invention for the first time.

An aluminum film of a 50 nm thickness is evaporated by the resistor-heating method. Three different kinds of double interdigital transducers are produced by wet-etching the Al film selectively by the photolithography. A first one has a 0.5 μm line width and 0.5 μm spacing. A second one has a 1 μm line width and 1 μm spacing. A third one has a 2 μm line width and 2 μm spacing. The period of the electrodes determines the wavelength λ of the surface acoustic wave which is oscillated by the electrodes. The suitable wavelength ranges from 1 μm to 16 μm. The 0.5 μm, 1 μm or 2 μm line width (and spacing) corresponds to a SAW wavelength λ of 2 μm, 4 μm or 8 μm respectively. Finally, a 0.32 μm, 0.64 μm, or 1.28 μm thick ZnO films are deposited on the interdigital electrodes of the widths of 0.5 μm, 1 μm or 2 μm and the diamond film as a piezoelectric film by the magnetron sputtering method. Otherwise, the diamond films are sometimes first covered with the ZnO films and the electrodes are further deposited on the ZnO film. A plenty of SAW devices are produced lengthwise and crosswise in a single wafer. Then the wafer is scribed along cleavage lines into individual chips. Plenty of SAW filters are obtained from a wafer.

Three kinds of SAW devices ①, ②, and ③ are now specified together by the following parameters. ① λ=4 μm, line width=0.5 μm, spacing=0.5 μm, ZnO film=0.32 μm ② λ=8 μm, line width=1 μm, spacing=1 μm, ZnO film=0.64 μm ③ λ=16 μm, line width=2 μm, spacing=2 μm, ZnO film= 1.28 μm For each of kinds of SAW filters, 14 kinds of SAW filters are produced from 14 wafers having different sizes of diamond granules in the films. Thus 42 different sorts of specimens are produced. The diamond wafers having different sizes of grains are numbered from sample 13 to sample 26 in common to ①, ②, and ③. These 14 of SAW filters are numbered from sample 13 to sample 26. Thus specimens are called by the same number.

The relation between the average diameter of diamond crystal grains and the propagation loss per wavelength due to diamond film is investigated in samples 13 to 26. Table 7 indicates the average diameter of crystal grains (μm) and the propagation loss (dB/λ) per wavelength. The propagation loss per unit length is obtained by multiplying the propagation loss per λ by wavelength. But the propagation los per unit length is meaningless. Then the propagation loss is expressed by the value per wavelength.

TABLE 7

Relation of diamond grain size and propagation loss

| sample No. | average diameter of diamond grains (μm) | propagation loss per wavelength in diamond film (dB/λ) | | |
|---|---|---|---|---|
| | | λ = 4 μm | λ = 8 μm | λ = 16 μm |
| 13 | 110 | 0.008 | 0.008 | 0.008 |
| 14 | 82 | 0.008 | 0.010 | 0.012 |
| 15 | 39 | 0.010 | 0.012 | 0.023 |
| 16 | 27 | 0.011 | 0.025 | 0.029 |
| 17 | 18 | 0.015 | 0.030 | 0.030 |
| 18 | 10 | 0.023 | 0.032 | 0.029 |
| 19 | 5 | 0.035 | 0.028 | 0.025 |
| 20 | 3.0 | 0.029 | 0.027 | 0.014 |
| 21 | 1.6 | 0.027 | 0.012 | 0.014 |
| 22 | 1.1 | 0.025 | 0.010 | 0.013 |
| 23 | 0.8 | 0.013 | 0.010 | 0.013 |
| 24 | 0.5 | 0.010 | 0.011 | 0.012 |
| 25 | 0.3 | 0.011 | 0.008 | 0.011 |
| 26 | 0.2 | 0.009 | 0.009 | 0.010 |

The total propagation loss measured contains the contributions from the diamond film and the ZnO film. The loss induced by the ZnO film is a known parameter. The loss due to diamond can be calculated by subtracting the ZnO's loss from the total measured loss. The diamond-induced propagation loss depends on the grain sizes of diamond crystals in the films. A good SAW filter requires a small propagation loss less W than 0.02 dB/λ. ① λ=4 μm: Samples 13 to 17 and samples 23 to 26 satisfy this requirement (W≦0.02 dB/λ) for case ①. Samples 13 to 17 have an average grain size more than 18 μm which is about five times as long as the wavelength λ (4 μm). Samples 23 to 26 have an average grain size less than 0.8 μm which is one fifth of the wavelength λ (4 μm). ② λ=8 μm: Samples 13 to 15 and samples 21 to 26 satisfy this requirement for case ②. Samples 13 to 15 have an average grain size more than 39 μm which is about five times as long as the wavelength λ (8 μm). Samples 21 to 26 have an average grain size less than 1.6 μm which is one fifth of the wavelength λ. ③ λ=16 μm: Samples 13 to 14 and samples 20 to 26 satisfy this requirement for case ③. Samples 13 to 14 have an average grain sizes more than 80 μm which is about five times as long as the wavelength λ (16 μm). Samples 20 to 26 have an average grain size less than 3 μm which is about one fifth of the wavelength λ.

The result of Table 7 indicates that the average grain sizes of diamond should be either larger than five times of λ or smaller than a fifth of λ. This is simply represented by $D_a \geq 5\lambda$ or $D_a \leq \lambda/5$, where $D_a$ is the average diameter of diamond grains.

The relation between the propagation loss of the SAW filter and the insertion loss of the SAW filter is investigated in other samples 27 to samples 33. The result is listed in Table 8.

TABLE 8

| | Relation of propagation loss and insertion loss | |
|---|---|---|
| sample NO. | propagation loss of SAW in diamond film (dB/λ) | insertion loss of SAW filter (dB) |
| 27 | 0.04 | 4.7 |
| 28 | 0.035 | 4.2 |
| 29 | 0.028 | 3.7 |
| 30 | 0.02 | 3.0 |
| 31 | 0.015 | 2.8 |
| 32 | 0.013 | 2.7 |
| 33 | 0.010 | 2.5 |

The increase of the propagation loss raises the insertion loss of the SAW filter, although the relation thereof is not proportional. Preferably the insertion loss should be less than 3.0 db. Samples 27 to 29 fail in satisfying this condition. Samples 30 to 33 succeed in satisfying the condition. Thus the propagation loss should be smaller than 0.02 dB/λ in order to supress the propagation loss less than 3.0 dB.

What we claim is:

1. A diamond wafer comprising:

a distorted substrate which is substantially flat in a free-standing state, and a (100) oriented polycrystalline diamond film synthesized directly on the substrate by a CVD method and polished to a roughness of less than Rmax50 nm and Ra20 nm, wherein the wafer is a circular wafer with a center and a periphery and is distorted monotonously from the center to the periphery without a deflection point, wherein the wafer has a distortion height H, which is defined as a height from the center of the wafer to a plane including a circumference of the wafer, satisfying an inequality 2 μm≦|H|≦150 μm, wherein the substrate is a Si single crystal wafer, a GaAs single crystal wafer, an AlN crystal wafer, a $LiNbO_3$ wafer, a $LiTaO_3$ wafer or a quartz wafer, and wherein interdigital transducers of comb-shaped electrodes are formed on the diamond film, and a piezoelectric film is formed on the interdigital transducers and the diamond film, wherein the diamond film, the interdigital electrodes and the piezoelectric film form a surface acoustic wave device, and wherein a plurality of surface acoustic wave devices are arranged lengthwise and crosswise on the wafer.

2. A diamond wafer as claimed in claim 1, wherein an average diameter $D_a$ of diamond polycrystal granules of the diamond film is less than one fifth of a wavelength λ of the surface acoustic wave which is determined by the spacing of the electrodes of the interdigital transducers.

3. A diamond wafer as claimed in claim 2, wherein the wavelength λ of the surface acoustic wave ranges from 1 μm to 16μm.

4. A diamond wafer as claimed in claim 3, wherein a propagation loss of the surface acoustic wave in the diamond film is less than 0.02 dB/λ.

5. A diamond wafer as claimed in claim 4, wherein the surface acoustic wave device is a filter and an insertion loss of the filter is less than 3 dB.

6. A diamond wafer as claimed in claim 1, wherein an average diameter $D_a$ of diamond polycrystal granules of the diamond film is more than five times as long as a wavelength λ of the surface acoustic wave which is determined by the spacing of the electrodes of the interdigital transducers.

7. A diamond wafer as claimed in claim 6, wherein the wavelength λ of the surface acoustic wave ranges from 1 μm to 16 μm.

8. A diamond wafer as claimed in claim 7, wherein a propagation loss of the surface acoustic wave is less than 0.02 dB/λ.

9. A diamond wafer as claimed in claim 8, wherein the surface acoustic wave device is a filter and an insertion loss of the filter is less than 3 dB.

10. A diamond wafer comprising:

a distorted substrate which is substantially flat in a free-standing state, and a (100) oriented polycrystalline diamond film synthesized directly on the substrate by a CVD method and polished to a roughness of less than Rmax50 nm and Ra2 nm, wherein the wafer is a circular wafer with a center and a periphery and is distorted monotonously from the center to the periphery without a deflection point, wherein the wafer has a distortion height H, which is defined as a height from the center of the wafer to a plane including a circumference of the wafer, satisfying an inequality 2 μm≦|H|≦150 μm, wherein the substrate is a Si single crystal wafer, a GaAs single crystal wafer, an AlN crystal wafer, a $LiNbO_3$ wafer, a $LiTaO_3$ wafer or a quartz wafer, and wherein a piezoelectric film is formed on the diamond film, and interdigital transducers of comb-shaped electrodes are formed on the piezoelectric film, wherein the diamond film, the interdigital electrodes and the piezoelectric film form a surface acoustic wave device, and wherein a plurality of surface acoustic wave devices are arranged lengthwise and crosswise on the wafer.

11. A diamond wafer as claimed in claim 10, wherein an average diameter $D_a$ of the diamond polycrystal granules of the diamond film is less than one fifth of a wavelength λ of the surface acoustic wave which is determined by the spacing of the electrodes of the interdigital transducers.

12. A diamond wafer as claimed in claim 11, wherein the wavelength λ of the surface acoustic wave ranges from 1 μm to 16 μm.

13. A diamond wafer as claimed in claim 12, wherein a propagation loss of the surface acoustic wave in the diamond film is less than 0.02 dB/λ.

14. A diamond wafer as claimed in claim 13, wherein the surface acoustic wave device is a filter and an insertion loss of the filter is less than 3 dB.

15. A diamond wafer as claimed in claim 10, wherein an average diameter $D_a$ of diamond polycrystal granules of the diamond film is more than five times as long as a wavelength λ of the surface acoustic wave which is determined by the spacing of the electrodes of the interdigital transducers.

16. A diamond wafer as claimed in claim 15, wherein the wavelength λ of the surface acoustic wave ranges from 1 μm to 16 μm.

17. A diamond wafer as claimed in claim 16, wherein a propagation loss of the surface acoustic wave is less than 0.02 dB/λ.

18. A diamond wafer as claimed in claim 17, wherein the surface acoustic wave device is a filter and an insertion loss of the filter is less than 3 dB.

19. A method of producing a diamond wafer comprising the steps of:

setting a substrate which is substantially flat in a free-standing state on a susceptor in a reaction chamber, heating the substrate to provide a heated substrate, supplying a material gas including hydrogen gas and a hydrocarbon gas to the reaction chamber, exciting the material gas by heat, microwave, RF-discharge, or DC-discharge, growing a (100) oriented polycrystalline diamond film directly on the heated substrate and thereby distorting the substrate, and polishing the diamond film to a roughness of less than Rmax50 nm and less than Ra20 nm, wherein the wafer is a circular wafer with a center and a periphery and is distorted monotonously from the center to the periphery without a deflection point, and wherein the wafer has a distortion height H, which is defined as a height from the center of the wafer to a plane including a circumference of the wafer, satisfying an inequality 2 µm≦|H|≦150 µm.

20. A method as claimed in claim 19, wherein the concentration of hydrocarbon in the material gas is higher in an earlier stage of synthesizing diamond and is lower in a later stage of synthesizing diamond.

21. A method as claimed in claim 20, wherein the hydrocarbon concentration in the earlier stage is more than twice as much as the hydrocarbon concentration in the later stage.

22. A method as claimed in claim 21, wherein the hydrocarbon concentration in the earlier stage is more than 2 vol %.

23. A method as claimed in claim 21, wherein the hydrocarbon concentration in the later stage is less than 3 vol %.

24. A method as claimed in claim 22, wherein an absolute value of the distortion height H which is defined as a height of the center from a plane including a circumference of the substrate ranges between 2 µm and 150 µm after the growth of the film and an absolute value of the distortion height ranges from 2 µm to 150 µm after the polishing.

25. A method as claimed in claim 23, wherein the substrate has a roughness between Ra1 nm and Ra100 nm and a density of the nucleus generation in the earlier stage is more than $10^{10}/cm^2$.

* * * * *